United States Patent
Mitani

(10) Patent No.: US 6,999,347 B2
(45) Date of Patent: Feb. 14, 2006

(54) NON-VOLATILE SEMICONDUCTOR MEMORY DEVICE WITH EXPECTED VALUE COMPARISON CAPABILITY

(75) Inventor: Hidenori Mitani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/935,289

(22) Filed: Sep. 8, 2004

(65) Prior Publication Data

US 2005/0057994 A1 Mar. 17, 2005

(30) Foreign Application Priority Data

Sep. 11, 2003 (JP) ............................. 2003-319625

(51) Int. Cl.
*G11C 16/06* (2006.01)
(52) U.S. Cl. .............................. 365/185.22; 365/185.12
(58) Field of Classification Search ........... 365/185.22, 365/185.12, 185.11
See application file for complete search history.

(56) References Cited

U.S. PATENT DOCUMENTS

| | | | |
|---|---|---|---|
| 6,747,894 B1 * | 6/2004 | Kawamura | 365/185.03 |
| 6,819,596 B1 * | 11/2004 | Ikehashi et al. | 365/185.22 |
| 6,882,569 B1 * | 4/2005 | Hosono et al. | 365/185.17 |

FOREIGN PATENT DOCUMENTS

| JP | 9-259593 | 10/1997 |
|---|---|---|
| JP | 2001-155500 A | 6/2001 |

\* cited by examiner

*Primary Examiner*—Anh Phung
(74) *Attorney, Agent, or Firm*—McDermott Will & Emery LLP

(57) ABSTRACT

In response to a control command from a CPU, memory cell data read out from a memory cell is stored in a page buffer via a verify circuit. The page buffer provides page buffer data to the verify circuit. The verify circuit is added with the capability of carrying out expected value comparison with memory cell data, and can complete, concurrently during internal data readout, expected value comparison that was conventionally carried out with an external tester. The expected value comparison result of the verify circuit is output to an SR register as a verify determination signal.

7 Claims, 10 Drawing Sheets

| MODE | VC1 | VC2 | VC3 |
|---|---|---|---|
| OEV | L | L | H |
| PV,VLC | L | H | H |
| EV | H | L | L |
| FLASH-PB | H | L | H |

NON-VOLATILE SEMICONDUCTOR MEMORY DEVICE WITH EXPECTED VALUE COMPARISON CAPABILITY

BACKGROUND OF THE INVENTION

1. Field of the Invention

The present invention relates to non-volatile semiconductor memory devices, and more particularly, to a non-volatile semiconductor memory device conducting programming/erasure by controlling electrons in a floating gate.

2. Description of the Related Art

A flash memory that is one type of a non-volatile semiconductor memory device carries out programming/erasure by controlling electrons in a floating gate. As used herein, introducing electron to a floating gate is referred to as "programming". By such programming, a memory cell takes the logic value of "0", and the threshold voltage of the memory cell transistor becomes higher. Drawing out electrons from a floating gate is referred to as "erasure". By such erasure, the memory cell takes a logic value of "1", and the threshold voltage of the memory cell transistor becomes lower.

In a flash memory, testing is conducted to verify whether such operations are effected properly within the specification value of the memory cell. Unintentional draw out or introduction of electrons may occur in a memory cell under various conditions and status. When electrons are drawn out or introduced, the threshold voltage of the memory cell transistor will be shifted, inducing the possibility of altering the logic value of the memory cell. In a flash memory, testing is conducted to verify whether such change in the logic value of a memory cell has occurred or not. Such testing is mainly divided into the three groups: expected value pattern readout test, erasure operation confirmation test, and erasure/programming repetitive test.

In an expected value pattern readout test, burn-in testing, bake testing, stress testing, and the like are conducted to verify whether the data in the memory cells have changed or not before and after these testing. Specifically, the entire region of the chip is read out for comparison with an expected value using a tester. Accordingly, any defective (NG) chips can be rejected by the threshold voltage shifting based on disturbance, accelerated testing, and the like.

In an erasure operation confirmation test, a normal erasure command is input to effect an erasure operation. If the erasure operation does not end within a specified time, that chip is rejected as falling the test. Specifically, the erasure time or the maximum value of erasure count is set at the tester side. Determination is made of failure at the tester side when the maximum value is surpassed.

In an erasure/programming repetitive test, program data, all "0" in particular, are loaded from an external source to a page buffer in the flash memory, and programming is initiated. When programming ends, erasure is conducted to set all the data in the memory cells to "1". By repeating such programming and erasure, change in the threshold voltages of the memory cells is tested.

In order to shorten the time required for such testing, each operation of read out, programming, and erasure must be conducted as fast as possible by improving the performance or capability of the semiconductor chip. Furthermore, determination of the testing results must be made efficiently.

A non-volatile semiconductor memory device disclosed in Japanese Patent Laying-Open No. 2001-155500 includes a verify circuit, corresponding to a memory block, for comparing output data from a memory block with expected value data. Accordingly, verify testing can be executed concurrently for every memory block to increase the speed of the verify testing.

A non-volatile semiconductor memory device disclosed in Japanese Patent Laying-Open No. 09-259593 has the erasure operation stopped when the operation mode does not proceed to the next operation within a set period of time of a timer.

These non-volatile semiconductor memory devices allow for a shorter testing time. There are other non-volatile semiconductor memory devices capable of reducing the testing time.

SUMMARY OF THE INVENTION

An object of the present invention is to provide a non-volatile semiconductor memory device capable of reducing testing time.

According to an aspect of the present invention, a non-volatile semiconductor memory device includes a command input unit recognizing an externally applied command input, a verify circuit receiving a control signal from the command input unit to output a verify determination signal, a memory cell from which memory cell data is read out to the verify circuit, a page buffer storing memory cell data via the verify circuit to output page buffer data to the verify circuit, and a status register comparing and determining the verify determination signal of a plurality of addresses to output a final determination signal. The verify circuit can carry out an expected value comparison of memory cell data in addition to a verify operation.

A non-volatile semiconductor memory device according to another aspect of the present invention includes a command input unit recognizing an externally applied command input, a control circuit receiving a control signal from the command input unit to output an OER control signal that sets an over erase recovery operation, a loop timer receiving the OER control signal to set a timer for an over erase recovery operation to output an abort signal according to a timer operation, and a status register controlling acceptance of an internal command.

A non-volatile semiconductor memory device according to a further aspect of the present invention includes a command input unit recognizing an externally applied command input, a verify circuit receiving a control signal from the command input unit to carry out a verify operation, a memory cell from which memory cell data is read out to the verify circuit, a page buffer receiving an externally applied data input and a bit line clear signal from the command input unit to store the memory cell data via the verify circuit and output page buffer data to the verify circuit, and a status register storing a verify determination result from the verify circuit. The page buffer can instantly set the internally stored data to "0" in accordance with the bit line clear signal.

By the present invention, the testing time can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
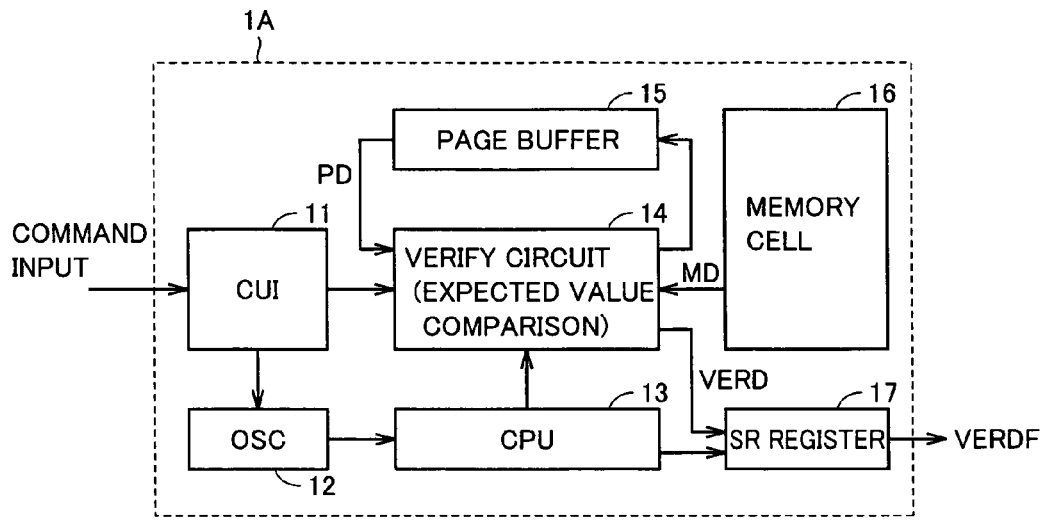
FIG. 1 is a schematic block diagram showing a structure of a non*volatile semiconductor memory device 1A according to a first embodiment.

Embodiments of the present invention will be described hereinafter with reference to the drawings. In the drawings, the same or corresponding elements have the same reference characters allotted, and the description thereof will not be repeated.

First Embodiment

Referring to FIG. 1, a non-volatile semiconductor memory device 1A according to a first embodiment includes a CUI (Command User Interface) 11, an internal clock generation circuit (also referred to as OSC hereinafter) 12, a CPU (Central Processing Unit) 13, a verify circuit 14, a page buffer 15, a memory cell 16, and a status register (also referred to as SR register hereinafter) 17.

CUI 11 recognizes an externally applied command input to output a control signal to OSC 12 and verify circuit 14. OSC 12 receives the control signal from CUI 11 to output a clock signal to CPU 13. CPU 13 receives the clock signal to control the internal operation of non-volatile semiconductor memory device 1A including verify circuit 14. Verify circuit 14 receives the control signal from CUI 11 and CPU 13 to carry out an operation such as verify, and the like. Page buffer 15 is mainly used in an internal reading operation.

The reading operation of non-volatile semiconductor memory device 1A is mainly classified into a normal reading operation and an internal reading operation. In a normal reading operation, a readout path is selected according to an externally applied command signal, control signal, and address signal. The data read out from memory cell 16 is output through the selected readout path. The internal reading operation will be described hereinafter.

An externally applied command for internal reading is input to CUI 11. CUI 11 generates a control signal according to the internal readout command to output the generated control signal to OSC 12. OSC 12 receives the control signal from CUI 11 to output a clock signal to CPU 13. CPU 13 receives this clock signal to control the internal operation of non-volatile semiconductor memory device 1A including verify circuit 14. In response to the control command from CPU 13, memory cell data MD read out from a memory cell 16 is stored in page buffer 15 via verify circuit 14. This internal reading operation is also referred to as a flash-PB (Page Buffer) operation. Page buffer 15 outputs page buffer data PD to verify circuit 14.

In non-volatile semiconductor memory device 1A of the first embodiment, verify circuit 14 is added with the capability of expected value comparison to verify whether memory cell data MB read out from memory cell 16 is equal to a predetermined expected value. Accordingly, expected value comparison that was conventionally carried out by an external tester can be completed simultaneously during internal data reading. The expected value comparison capability of verify circuit 14 will be described in detail afterwards with reference to a circuit diagram. The expected value comparison result of verify circuit 14 is output to SR register 17 as a verify determination signal VERD.

SR register 17 receives the control signal from CPU 13 to compare verify determination signal VERD at a certain address with a verify determination signal VERD at the next address to conduct comparison and determination of verify determination result VERD of a plurality of addresses. If a verify determination signal indicative of failure is input at least once into SR register 17, SR register 17 stores a verify determination signal indicative of failure even if all the subsequent verify determination signals input are indicative of passing. Thus, when an expected value comparison readout is effected for the entire address space in the chip, the final determination result corresponds to "pass" only when all the data have passed, and the final determination result is output as NG even if there is only one bit that indicates failure. The configuration of SR register 17 will be described afterwards. The final determination result of SR register 17 is output as final determination signal VERDF.

Figure 2:
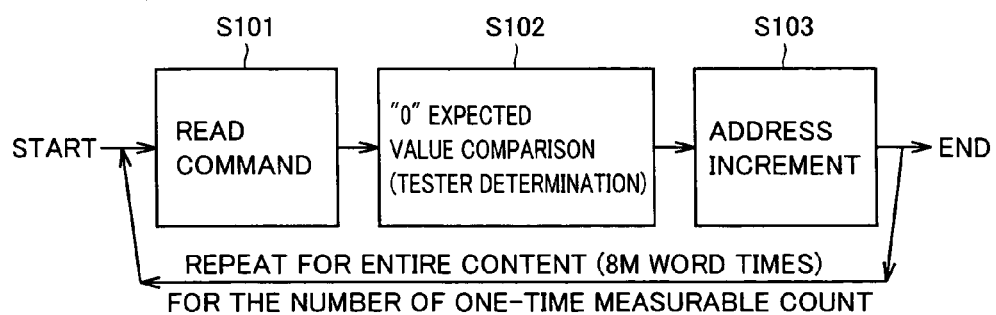
FIG. 2 is a flow chart representing an expected value pattern readout test procedure as the background for describing an expected value pattern readout test procedure of non-volatile semiconductor memory device 1A of the first embodiment.

The expected value pattern readout test procedure of non-volatile semiconductor memory device 1A of the first embodiment will be described here. First the background expected value pattern readout test procedure will be described with reference to FIG. 2.

At step S101, a read command is input. In response, comparison with an expected value of "0" is effected at step S102. This expected value comparison is carried out using an external tester. At step S103, the address is incremented. These steps S101–S103 are repeated for the entire content (8M word times), which are further repeated for a number of times corresponding to the one-time measurable count.

The background expected value pattern readout test procedure set forth above is generally of no concern when the reading address space is not so large. However, when read out is effected for the entire address space in the chip, the readout and tester determination operation will be extremely time-consuming if all the results are compared with an expected value using a tester and the comparison result is stored in the memory in the tester.

Figure 3:
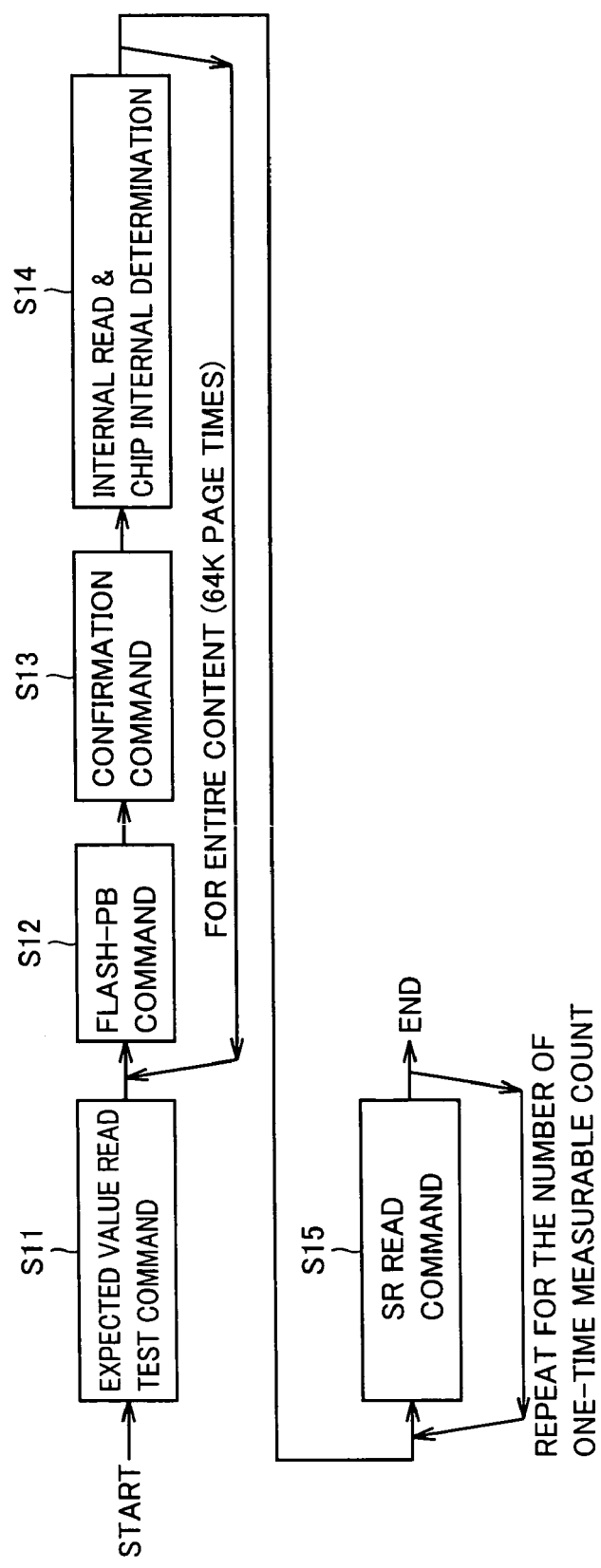
FIG. 3 is a flow chart representing an expected value pattern readout test procedure of non-volatile semiconductor memory device 1A of the first embodiment.

Particularly in a burn-in testing where testing is carried out with a plurality of chips attached to a burn-in board, expected value pattern readout determination must be carried out for every one chip even if more can be measured at one time since the input/output bus is used in common. Furthermore, the entirety must be read out for every one chip. Thus, there was a problem that the expected value pattern readout testing involving burn-in testing is extremely time-consuming. An expected value pattern readout test procedure of the first embodiment directed to overcome such problems will be described with reference to FIG. 3 hereinafter.

At step S11, an externally applied expected value read test command is provided to CUI 11 of FIG. 1. At step S12, an external flash-PD command is input to CUI 11 of FIG. 1. Accordingly, an internal verify reading operation is set up. At step S13, an external confirmation command is input to CUI 11 of FIG. 1. In response, an internal verify readout operation is initiated. The operation unit thereof corresponds to 128 words.

In response to reception of these commands, an internal read & chip internal determination operation is carried out at step S14 in verify circuit 14 of FIG. 1. Accordingly, memory cell data MD read out from memory cell 16 of FIG. 1 is written into page buffer 15 of FIG. 1. At the same time, determination is made whether memory cell data MD is "0" or not. These steps S11–S14 are repeated for the entire content (64K page times) to effect the internal read and chip internal determination operation over the entire content.

At step S15, an external SR read command is input to CUI 11 of FIG. 1. Accordingly, SR register readout is conducted for a number of times corresponding to the one-time measurable count at SR register 17 of FIG. 1. Eventually, determination is made whether the chip internal determination of steps S11–S14 indicates pass or failure. A specific configuration of verify circuit 14 of FIG. 1 will be described hereinafter with reference to FIG. 4.

Figures 4, 5:
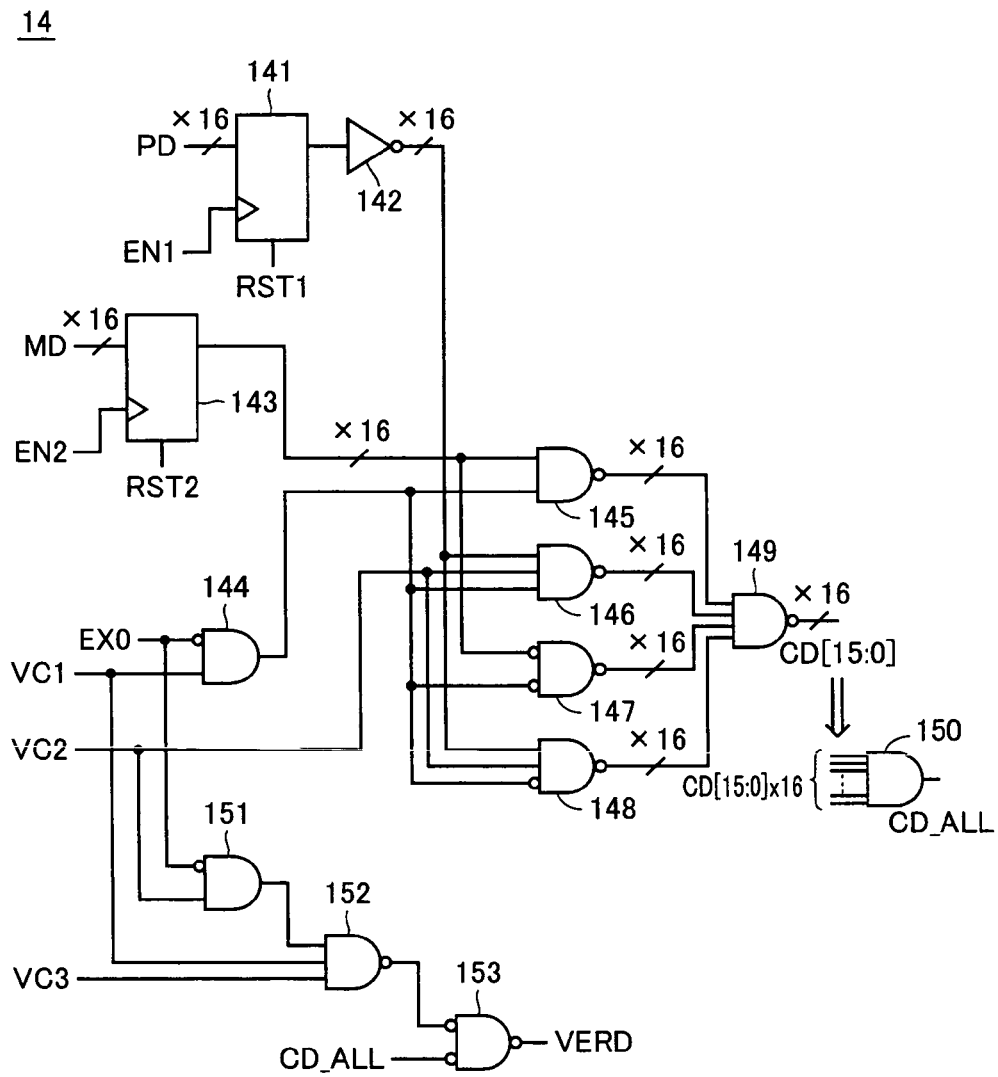
FIG. 4 is a circuit diagram of a specific configuration of a verify circuit 14 of the first embodiment.
FIG. 5 represents the modes of verify circuit 14 in accordance with a combination of the logic levels of verify control signals VC1, VC2 and VC3.

Referring to FIG. 4, verify circuit 14 of the first embodiment includes flip-flop circuits 141 and 143, an inverter 142, AND circuits 144, 150 and 151, NAND circuits 145, 146, 148, 149 and 152, and OR circuits 147 and 153. AND circuits 144 and 151, NAND circuit 152 and OR circuit 153 are also used in a normal verify operation.

Flip-flop circuit 141 temporarily retains page buffer data PD in synchronization with an enable signal EN1. Page buffer data PD retained in flip-flop circuit 141 is reset by a reset signal RST1. Inverter 142 inverts the output of flip-flop circuit 141. Flip-flop circuit 143 temporarily holds memory cell data MD in synchronization with enable signal EN2. Memory cell data MD held in flip-flop circuit 143 is reset by a reset signal RST2. AND circuit 144 receives an inverted signal of "0" expectation verify signal EX0 and a verify control signal VC1.

NAND circuit 145 receives an output signal of flip-flop circuit 143 and an output signal of AND circuit 144. NAND circuit 146 receives an output signal of inverter 142, verify control signal VC2, and an output signal of AND circuit 144. OR circuit 147 receives an output signal of flip-flop circuit 143 and an output signal of AND circuit 144. NAND circuit 148 receives an output signal of inverter 142, verify control 149 receives respective output signals of NAND circuits 145, 146 and 148, and OR circuit 147 to output a partial determination signal CD [15:0].

The above-described series of operation is repeated for a total of 16 bits with respect to other page buffer data PD and memory cell data MD. AND circuit 150 receives partial determination signals CD [15:0] of 16 bits and outputs a degenerated total determination signal CD_ALL. Specifically, total determination signal CD_ALL indicates "1" only when all partial determination signals CD [15:0] of 16 bits are "1".

AND circuit 151 receives an inverted signal of "0" expectation verify signal EX0 and a verify control signal VC2. NAND circuit 152 receives an output signal of AND circuit 151 and verify control signals VC1 and VC3. OR circuit 153 receives an output signal of NAND circuit 152 and total determination signal CD_ALL to output a verify determination signal VERD.

Verify circuit 14 having a structure set forth above takes a plurality of modes in accordance with the combination of the logic level of verify control signals VC1, VC2 and VC3. The operation of each mode of verify circuit 14 will be described hereinafter with reference to FIG. 5.

When verify control signals VC1, VC2 and VC3 attain an L level, an L level, and an H level, respectively, verify circuit 14 takes an OEV (Over Erase Verify) mode. In this OEV mode, verification of over erasure is conducted. AND circuit 144 receives verify control signal VC1 of an L level to provide an output signal of an L level. As a result, the output signals of NAND circuits 145 and 146 are fixed at an H level. Furthermore, in response to verify control signal VC2 of an L level, the output signal of NAND circuit 148 is also fixed at an H level.

The output signal of OR circuit 147 varies in accordance with the value of memory cell data MD. When memory cell data MD is at an L level, OR circuit 147 provides an output signal of an H level. When memory cell data MD is at an H level, OR circuit 147 provides an output signal of an L level. As a result, the signal level of partial determination signal CD [15:0] becomes equal to the signal level of memory cell data MD.

When verify control signals VC1, VC2 and VC3 attain an L level, H level, and an H level, respectively, verify circuit 14 takes a PV (Program Verify) mode or a VLC (Vth Lower Check) mode. In a PV mode, verification of writing is conducted. In a VLC mode, verification of lower threshold is carried out after over erasure bit writing. AND circuit 144 receives verify control signal VC1 of an L level to provide an output signal of an L level. As a result, the output signals of NAND circuits 145 and 145 are fixed at an H level.

The output signal of OR circuit 147 varies in accordance with the value of memory cell data MD. When memory cell data MD is at an L level, OR circuit 147 provides an output signal of an H level. When memory cell data MD is at H level, OR circuit 147 provides an output signal of an L level. Furthermore, the output signal of NAND circuit 148 varies in accordance with the value of page buffer data PD. Specifically, when page buffer data PD is at an L level, NAND circuit 148 provides an output signal of an L level. When page buffer data PD is at an H level, NAND circuit 148 provides an output signal of an H level. Accordingly, partial determination signal CD [15:0] attains an L level only when memory cell data MD is at an L level and page buffer data PD is at an H level.

When verify control signals VC1, VC2 and VC3 attain an H level, an L level, and an L level, respectively, verify circuit 14 takes an EV (Erase Verify) mode. In an EV mode, verification of erasure is conducted. NAND circuits 146 and 148 have their output signals fixed at an H level since verify control signal VC2 is at an L level.

NAND circuit 145 and OR circuit 147 vary in accordance with memory cell data MD and the value of "0" expectation verify signal EX0. NAND circuit 145 provides an output signal of an H level when memory cell data MD is at an L level or "0" expectation verify signal EX0 is at an H level. OR circuit 147 provides an output signal of an H level when memory cell data MD is at an H level or when "0" expectation verify signal EX0 is at an L level. Accordingly, partial determination signal CD [15:0] attains an L level when memory cell data MD and "0" expectation verify signal EX0 are at the same signal level.

In an EV mode, verify determination signal VERD output from OR circuit 153 is fixed at an H level independent of the determination result of total determination signal CD_ALL since verify control signal VC3 is at an L level.

When verify control signals VC1, VC2 and VC3 are at an H level, an L level, and an H level, respectively, verify circuit 14 takes a flash-PB mode. As stated previously, the flash-PB mode is directed to operation of verify circuit 14 without carrying out comparison since the content of memory cell 16 is written into page buffer 15 through a verify path. The output signals of NAND circuits 146 and 148 are fixed at an H level since verify control signal VC2 is at an L level.

NAND circuit 145 and OR circuit 147 vary in accordance with memory cell data MD and the value of "0" expectation verify signal EX0. NAND circuit 145 provides an output signal of an H level when memory cell data MD is at an L level or when "0" expectation verify signal EX0 is at an H level. OR circuit 147 provides an output signal of an H level when memory cell data MD is at an H level or when "0" expectation verify signal EX0 is at an L level. Accordingly, partial determination signal CD [15:0] attains an L level when memory cell data MD and "0" expectation verify signal EX0 are at the same signal level.

The operation of verify circuit 14 of FIG. 4 will be described hereinafter with reference to various signal waveforms.

Figure 6:
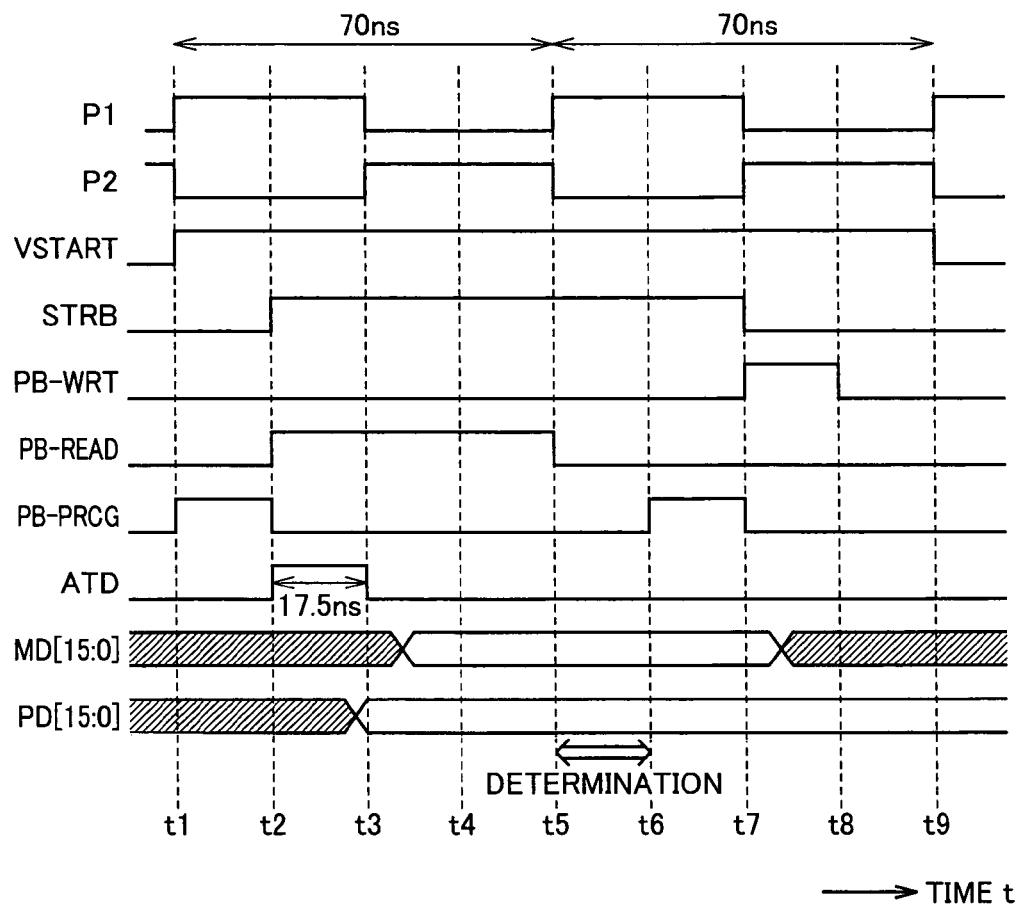
FIG. 6 is a timing chart to describe a circuit operation of verify circuit 14 of the first embodiment.

Referring to the timing chart of FIG. 6, clock signals P1 and P2 control the verify operation of verify circuit 14, and vary complementary to each other. At time t1, clock signal P1 is pulled up from an L level to an H level. In contrast, clock signal P2 is pulled down from an H level to an L level at time t1. The transition of clock signals P1 and P2 corresponds to one cycle (70 ns) from time t1 to time t4. One verify operation is completed in two cycles (70 ns×2=140 ns) from time t1 to time t9.

Furthermore, a verify start signal VSTART is pulled up to an H level from an L level at time t1. Accordingly, verify circuit 14 initiates a verify operation. Also at time t1, a bit line precharge signal PB-PRCG is pulled up to an H level from an L level. In response, the bit line of page buffer 15 of FIG. 1 is precharged. It is to be noted that page buffer 15 is formed of an SRAM (Static Random Access Memory).

At time t2, a verify sense amplifier activation signal STRB is driven from an L level to an H level. In response, a verify sense amplifier not shown of verify circuit 14 is rendered active. At time t2, a page buffer content readout signal PB-READ is pulled up to an H level from an L level. In response, page buffer data PD is read out from page buffer 15 of FIG. 1. At time t2, bit line precharge signal PB-PRCG is pulled down to an L level from an H level. At time t2, a verify sense amplifier precharge signal ATD is pulled up to an H level from an L level. Accordingly, a precharge operation of a verify sense amplifier not shown is executed.

At time t3, clock signal P1 is pulled down to an L level from an H level. In contrast, clock signal P2 is pulled up to an H level from an L level at the same time. Furthermore, page sense amplifier precharge signal ATD is pulled down to an L level from an H level at time t3. Verify sense amplifier precharge signal ATD attains an H level (time t2–t3) for 17.5 ns. Further, page buffer data PD [15:0] changes immediately before time t3. During time t3 and time t4, memory cell data MD CD [15:0] changes.

At time t5, clock signal P1 is pulled up to an H level from an L level. In contrast, clock signal P2 is pulled down to an L level from H level at the same time. Furthermore, page buffer content readout signal PB-READ is pulled down from an H level to an L level at time t5. At time t6, bit line precharge signal PB-PRCG is pulled up to an H level from an L level. Accordingly, the bit line of page buffer 15 in FIG. 1 is precharged again. The verify determination operation described with reference to FIG. 4 is conducted during time t5 and time t6.

At time t7, clock signal P1 is pulled down to an L level from an H level. In contrast, clock signal P2 is pulled up to an H level from an L level at the same time. Furthermore, verify sense amplifier activation signal STRB is pulled down from an H level to an L level at time t7. Write activation signal PB-WRT is pulled up to an H level from an L level at time t7. Accordingly, memory cell data MD is written from memory cell 16 of FIG. 1 to page buffer 15 via verify circuit 14.

At time t7, bit line precharge signal PB-PRCG is pulled down to an L level from an H level. The value of memory cell data MD 15:0 varies during time t7 and time t8. At time t8, write activation signal PB-WRT is pulled down to an L level from an H level.

At time t9, clock signal P1 is pulled up to an H level from an L level. In contrast, clock signal P2 is pulled down to an L level from an H level at the same time. Furthermore, verify start signal VSTART is pulled down to an L level from an H level at time t9. Thus, the verify operation of verify circuit 14 ends.

Referring to FIG. 4 again, verify determination signal VERD output from OR circuit 153 through any of the modes described with reference to FIG. 5 is provided to SR register 17, as shown in FIG. 1. A specific configuration of SR register 17 will be described hereinafter with reference to FIG. 7.

Figure 7:
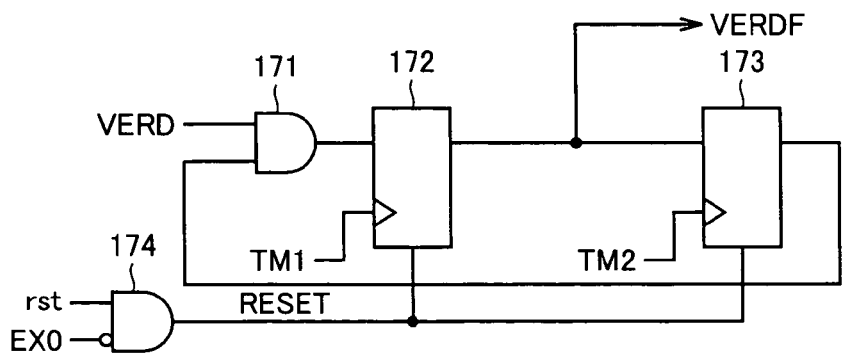
FIG. 7 is a circuit diagram of a specific configuration of an SR register 17 of the first embodiment.

Referring to FIG. 7, SR register 17 of the first embodiment includes AND circuits 171 and 174, and flip-flop circuits 172 and 173.

AND circuit 171 receives verify determination signal VERD and an output signal of flip-flop circuit 173. Flip-flop circuit 172 temporarily retains the output signal of AND circuit 171 in synchronization with timing signal TM1. Flip-flop circuit 173 temporarily retains the output signal of flip-flop circuit 172 in synchronization with timing signal TM2. AND circuit 174 receives a reset control signal rst and an inverted signal of "0" expectation verify signal EX0 to provide a reset signal RESET to each of flip-flop circuits 172 and 173. Flip-flop circuit 172 outputs final determination signal VERDF.

In the above-described flash-PB mode, a reset control signal rst is rendered active every time a command is input, whereby flip-flop circuits 172 and 173 are initialized. In SR register 17 of the first embodiment, the logical sum of reset control signal rst and an inverted signal of "0" expectation verify signal EX0 is taken as reset signal RESET of flip-flop circuits 172 and 173. Therefore, reset signal RESET is masked by an inverted signal of "0" expectation verify signal EX0. Final determination signal VERDF becomes "1" only when all verify determination signals VERD input corresponding to the one-time measurable count are "1".

Thus, non-volatile semiconductor memory device 1A of the first embodiment is added with the capability of carrying out expected value comparison in verify circuit 14. Non-volatile semiconductor memory device 1A executes expected value determination concurrently with the readout of memory cell data MD for all the addresses, and then conducts final determination based on a superposition of the determination results for the number of one-time measurable count at SR register 17. It is therefore no longer necessary to compare all the results with an expected value through a tester when the entire address space of the chip is read out.

The first embodiment was described based on an example of a verify circuit 14 determining whether the data are all "0" or "1". This is only a way of example, and determination on a checker pattern, a checker inversion pattern, or a more complicated pattern can be effected by adding an appropriate circuit to produce an expected value pattern.

The data in page buffer 15 is determined at the start and taken as the expected value. The value in page buffer 15 is not rewritten and is maintained even in a flash-PB operation. Accordingly, the expected value can be modified arbitrarily.

By adding the expected value comparison capability in verify circuit 14 in accordance with the first embodiment, the testing time required for an expected value pattern readout test can be reduced.

Second Embodiment

Figure 8:
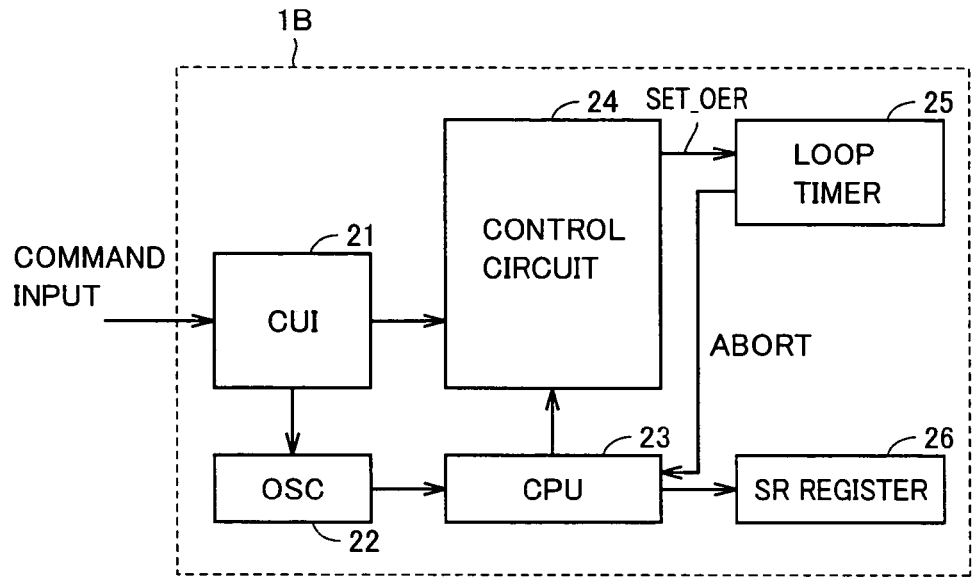
FIG. 8 is a schematic block diagram of a configuration of a non-volatile semiconductor memory device 1B according to a second embodiment.

Referring to FIG. 8, a non-volatile semiconductor memory device 1B according to a second embodiment includes a CUI 21, an internal clock generation circuit (also referred to as OSC hereinafter) 22, a CPU 23, a control circuit 24; a loop timer 25, and a status register (also referred to as SR register hereinafter) 26. Although not explicitly shown, control circuit 24 includes a power supply circuit and a path set circuit.

CUI 21 recognizes an externally applied command input to output a control signal to OSC 22 and control circuit 24. OSC 22 receives the control signal from CUI 21 to output a clock signal to CPU 23. CPU 23 receives the clock signal to control the internal operation of non-volatile semiconductor memory device 1B including control circuit 24. Control circuit 24 receives the control signal from CUI 21 and CPU 23 to conduct power supply control, path setting operation, and the like.

Loop timer 25 receives a control signal SET_OER (OER control signal) from control circuit 24 to set the timer for an OER operation, and provides abort signal ABORT to CPU 23. A specific configuration of loop timer 25 will be described afterwards. SR register 26 receives the control signal from CPU 23 to set a fail bit. By setting a fail bit, any subsequent internal operation command will not be accepted. Therefore, any further operation on a defective chip can be suppressed.

Figure 9:
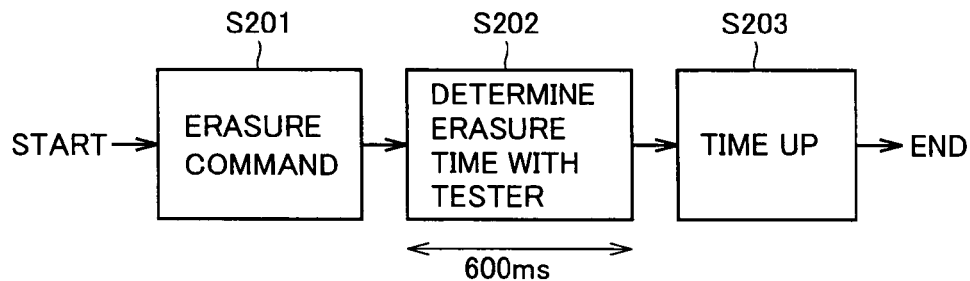
FIG. 9 is a flow chart representing an erasure operation confirmation test procedure as the background for describing an erasure operation confirmation test procedure of non-volatile semiconductor memory device 1B of the second embodiment.

An erasure operation confirmation test procedure of non-volatile semiconductor memory device 1B of the second embodiment will be described hereinafter. First, a background erasure operation confirmation test procedure will be described with reference to the flow chart of FIG. 9.

At step S201, an erasure command is input. In response, the time of erasure test is determined through an external tester at step S202. The general flow of an erasure sequence in a non-volatile semiconductor memory device (flash memory) is set forth below.

First, the threshold voltage of a memory cell is increased with an entire block pulse by a flash program. Second, an erasure pulse is applied after verification to lower the threshold voltage of the memory cell. Third, the threshold voltage of the memory cell is slightly increased with an entire block pulse by a soft flash program. Fourth, an erasure pulse is applied after the verification to reduce the threshold voltage of the memory cell. Fifth, presence of an over erase bit is verified. Sixth, a pulse is applied for every bit at the verify-fail site to increase the threshold voltage of the memory cell (over erase recovery operation).

The above-described erasure test time is approximately 600 ms in general. When the erasure testing time expires at step S203, the erasure operation confirmation test ends.

In the above-described background erasure operation confirmation test procedure, the threshold voltage of the memory cell will not be shifted to the lower side by the erasure pulse if the memory cell property is poor, consuming time for the erasure operation. Furthermore, when there are many over erasure bits, much time is required to write each of such bits at a time. Accordingly, the erasure testing time will expire in a conventional erasure operation confirmation test.

With regards to the expiration of the erasure testing time due to the presence of many over erasure bits, the erasure testing time depends on the number and characteristics of the over erasure bits. If a defective semiconductor chip is to be rejected in the above-described erasure operation confirmation test, waiting must be conducted until time up of the relevant test specification time. Even if another chip is subjected to testing at the same time, the erasure time of one chip takes so much time that the eventual erasure operation confirmation test will be time-consuming. An erasure operation confirmation test procedure of the second embodiment directed to overcome such a problem will be described hereinafter with reference to the flow chart of FIG. 10.

At step S21, an external erasure command is applied to CUI 21 of FIG. 8. At step S22, the erasure test time is determined in the chip. A specific determination operation in the chip corresponds to the following steps S22_1 to S22_3.

At step S22_1, an over erase recovery (OER) operation is conducted. At step S22_2, a timer operation is conducted. By way of example, the timer is set to 150 ms. At step S22_3, the erasure test time is eventually determined.

Following the specific determination operation of steps S22_1 to S22_3, control proceeds to step S23. The erasure operation confirmation test ends when the erasure test time expires. A portion of a specific circuit configuration of loop timer 25 of FIG. 8 will be described with reference to FIG. 11.

Loop timer 25 of the second embodiment includes an NOR circuit 241, NAND circuits 242 and 244, an OR circuit 243, inverters 245 and 246, a timer circuit 250, and a decode circuit 270.

NOR circuit 241 includes an inverted signal of a control signal TN_MLDISE and a control signal TMS_MLDISE. NAND circuit 242 receives a control signal TMS_ERSA-BRT and a control signal SET_OER. OR circuit 243 receives an output signal of NOR circuit 241 and an inverted signal of the output of NAND circuit 242. NAND circuit 244 receives a control signal CXLM4RRST and an output signal of OR circuit 243. Inverter 245 inverts the output signal of NAND circuit 244. Inverter 246 inverts an output signal of inverter 245. Inverter 245 provides an output signal to timer circuit 250 as a reset signal RST.

Figure 12:
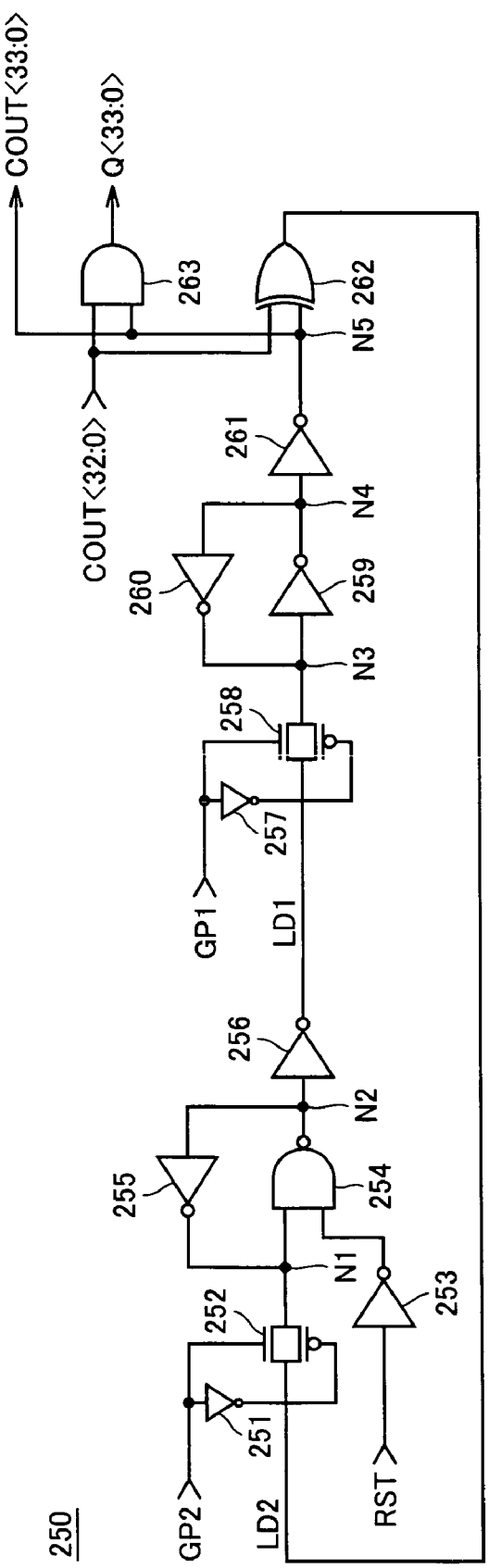
FIG. 12 is a circuit diagram showing a portion of a specific configuration of a timer circuit 250 of the second embodiment.

Timer circuit 250 receives a count control signal COUT <32:0>, clock signals GP1 and GP2, and a reset signal RST to output a count control signal COUT <33:0> and data signal Q <33:0>. Decode circuit 270 receives and decodes data signal Q <33:0> to output abort signal ABORT. A specific circuit configuration of timer circuit 250 will be described hereinafter with reference to FIG. 12.

Timer circuit 250 of the second embodiment includes inverters 251, 253, 255–257 and 259–261, transfer gates 252 and 258, a NAND circuit 254, an XOR circuit 262, and an AND circuit 263.

Inverter 251 inverts clock signal GP2. Transfer gate 252 responds to clock signal GP2 and an inverted signal thereof to electrically connect/disconnect output signal LD2 of XOR circuit 262 to/from a node N1. Inverter 253 inverts reset signal RST. NAND circuit 254 receives the signal at node N1 and an output signal of inverter 253, and has its output terminal connected to node N2. Inverter 255 has its input terminal connected to node N2, and its output terminal connected to node N1. Inverter 256 inverts the signal at node N2 to output the inverted signal as output signal LD1.

Inverter 257 inverts clock signal GP1. Transfer gate 258 responds to clock signal GP1 and an inverted signal thereof to electrically connect/disconnect output signal LD1 of inverter 252 to/from a node N3. Inverter 259 has its input terminal connected to node N3, and its output terminal connected to a node N4. Inverter 260 has its input terminal connected to node N4, and its output terminal connected to node N3. Inverter 261 has its input terminal connected to node N4, and its output terminal connected to a node N5.

XOR circuit 262 receives the signal at node N5 and count control signal COUT <32:0> to feed back output signal LD2 to transfer gate 252. AND circuit 263 receives the signal at node N5 and count control signal COUT <32:0> to output data signal Q <33:0>. Count control signal COUT <33:0> is output from node N5.

Figure 11:
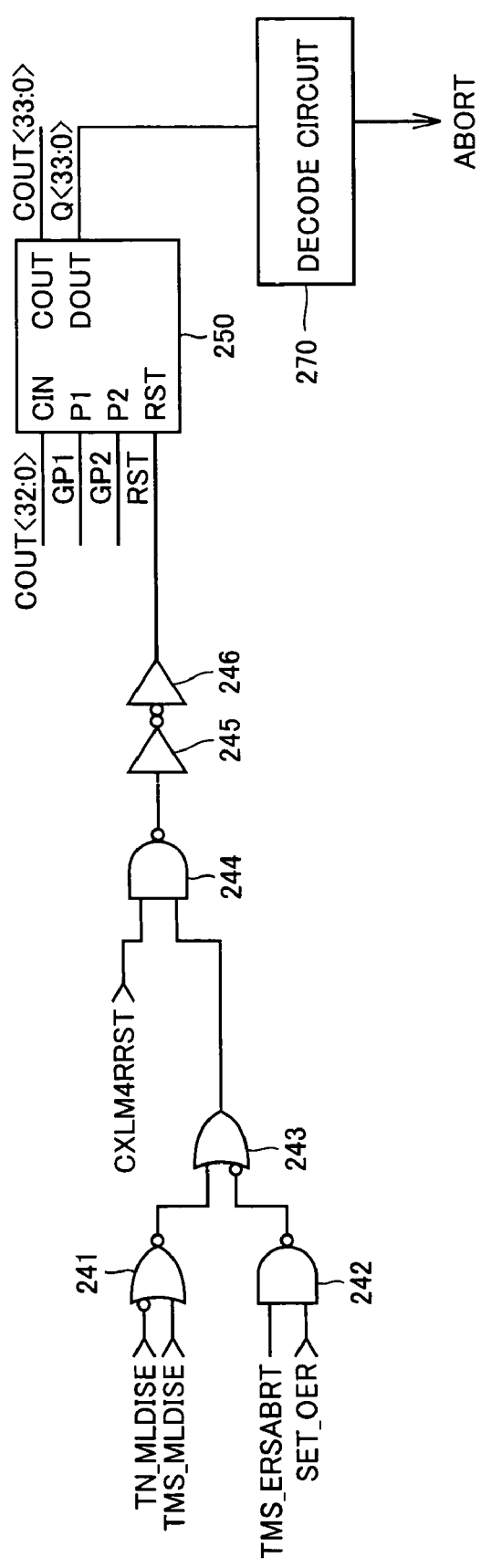
FIG. 11 is a circuit diagram showing a portion of a specific configuration of a loop timer 25 of the second embodiment.

The operation of loop timer 25 of FIG. 11 will be described hereinafter with reference to various signal waveforms.

Figure 10:
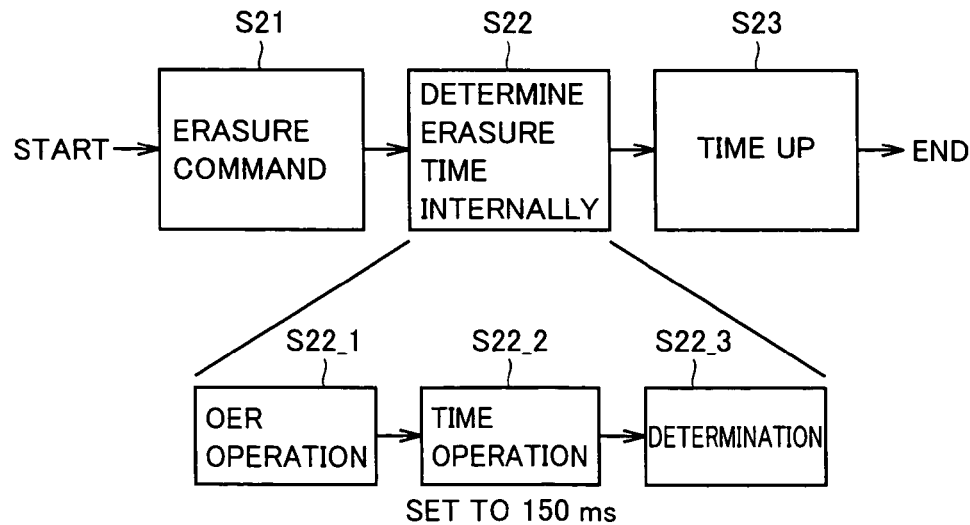
FIG. 10 is a flow chart of an erasure operation confirmation test procedure of non-volatile semiconductor memory device 1B of the second embodiment.
Figure 13:
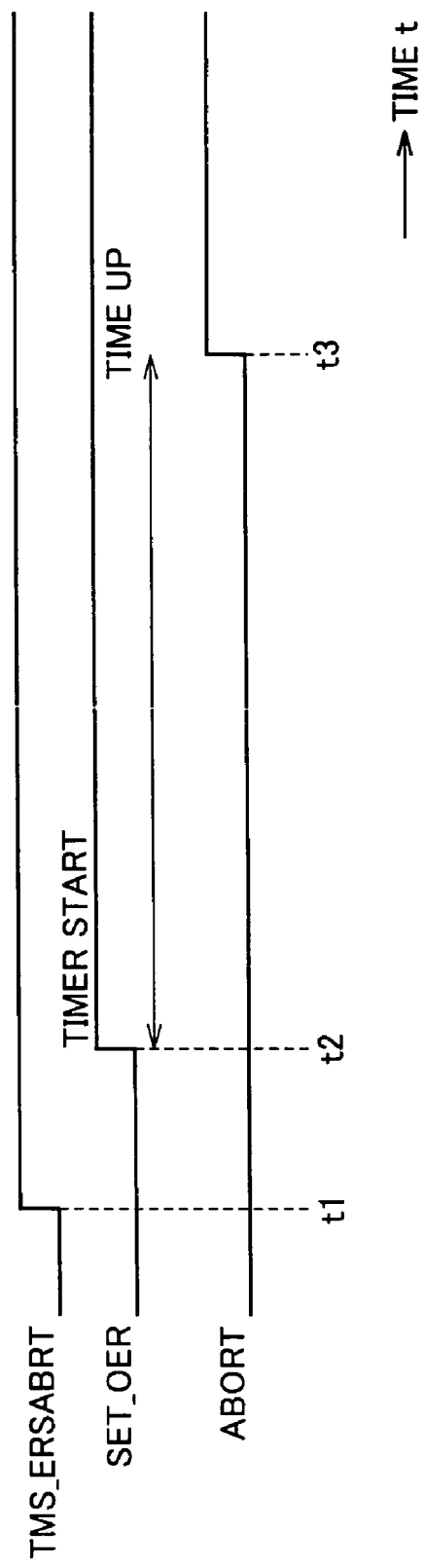
FIG. 13 is a timing chart to describe an operation of loop timer 25 of the second embodiment.

Referring to the timing chart of FIG. 13, an external erasure command is input to CUI 21 of FIG. 8 at time t1 (step S21 of FIG. 10). In response, control signal TMS_ERSABRT is pulled up to an H level from an L level. At time t2, control signal SET_OER output from control circuit 24 of FIG. 8 is pulled up to an H level from an L level. Accordingly, non-volatile semiconductor memory device 2B initiates an OER operation. As a result, reset signal RST applied to timer circuit 250 attains an L level when control signal CXLM4RRST is at an H level, as shown in FIG. 11. In response, timer circuit 250 initiates a timer operation at time t2 (step S22_2 of FIG. 10).

If the OER operation is not completed within the timer set time of timer circuit 250, abort signal ABORT is driven to an H level from an L level at time t3. Accordingly, determination is made that the erasure test time has expired, and the erasure operation confirmation test ends (step S23 of FIG. 10). If the OER operation is completed within the timer set time of timer circuit 250, control signal SET_OER is pulled down to an L level from an H level, though not explicitly shown in FIG. 13. Accordingly, reset signal RST is rendered active of an H level depending upon the logic status of control signals TN_MLDISE, TMS_MLDISE, CXLM4RRST. In response, timer circuit 250 is reset.

In non-volatile semiconductor memory device 1B of the second embodiment, an OER operation is carried out under determination of an erasure test time to determine activation/inactivation of abort signal ABORT depending upon whether the OER operation is completed within the timer set time. Thus, it is no longer necessary to wait for the expiration of the relevant test specification time for rejecting a defective semiconductor chip in an erasure operation confirmation test as in the conventional case.

By determining activation/inactivation of the abort signal depending upon whether the OER operation is completed within the timer set time in the second embodiment, the testing time for an erasure operation confirmation test can be reduced.

Third Embodiment

Figure 14:
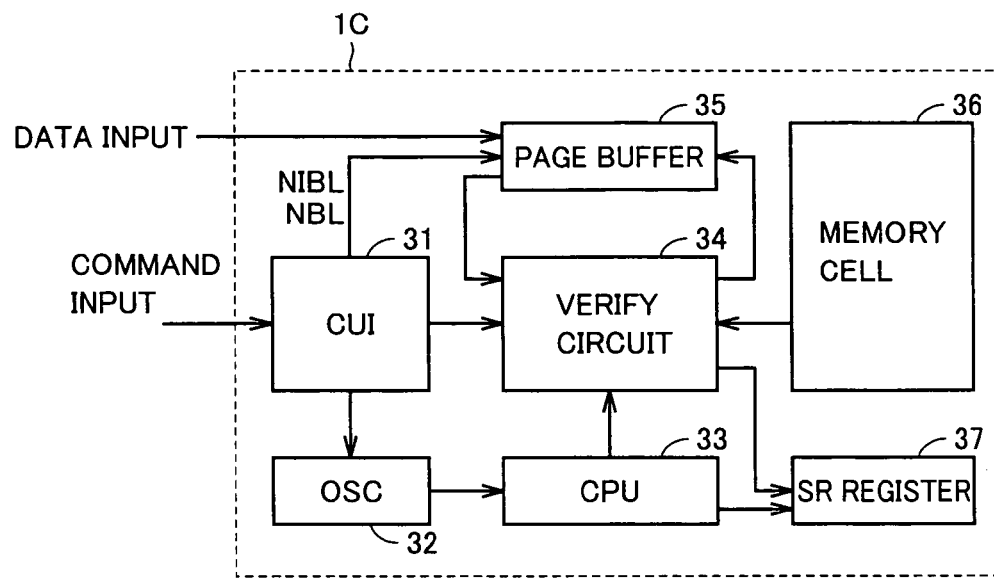
FIG. 14 is a schematic block diagram of a configuration of a non-volatile semiconductor memory device 1C according to a third embodiment.

Referring to FIG. 14, a non-volatile semiconductor memory device 1C according to a third embodiment includes a CUI 31, an internal clock generation circuit (also referred to as OSC hereinafter) 32, a CPU 33, a verify circuit 34, a page buffer 35, a memory cell 36, and a status register (referred to as SR register hereinafter) 37.

CUI 31 recognizes an externally applied command input to output a control signal to OSC 32, verify circuit 34, and page buffer 35. OSC 32 receives the control signal from CUI 31 to output a clock signal to CPU 33. CPU 33 receives the clock signal to control the internal operation of non-volatile semiconductor memory device 1C including verify circuit 34. Verify circuit 34 receives the control signals from CUI 31 and CPU 33 to conduct a verify operation and the like.

Page buffer 35 receives an externally applied data input, and bit line clear signals NIBL and NBL output from CUI 31. Page buffer 35 stores memory cell data from memory cell 36 via verify circuit 34 (flash-PB operation), and provides page buffer data to verify circuit 34. SR register 37 receives a control signal from CPU 33 to store the verify determination result output from verify circuit 34.

Figure 15:
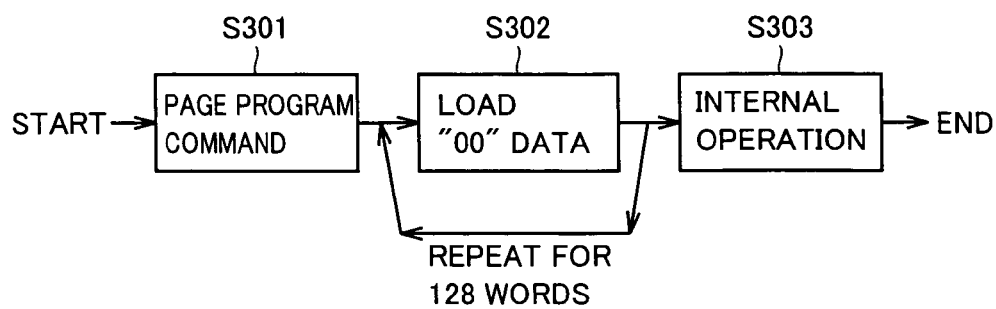
FIG. 15 is a flow chart of an erasure/programming repetitive test procedure as a background for describing an erasure/programming repetitive test procedure of non-volatile semiconductor memory device 1C of the third embodiment.

An erasure/programming repetitive test procedure of non-volatile semiconductor memory device 1C of the third embodiment will be described hereinafter. First, a background erasure/programming repetitive test procedure will be described with reference to FIG. 15.

At step S301, a page program command is applied to page buffer 35. At step S302, data loading of "00" is repeated for 128 words. Then, an internal operation of erasure/programming is conducted at step S303.

The above-described background erasure/programming repetitive test procedure consumes time corresponding to the repetition of programming/erasure. In a conventional erasure/programming repetitive test, all the data is set to "1" by an erasure command, and all the data is set to "0" by a program command. When all the data are set to "0" by a program command, data "0" must be loaded after the command input.

In a conventional erasure/programming repetitive test, external data "00" is input for every word with respect to a page buffer. Then, the programmed data is modified from "00" to "FF" at every programming and verify operation.

Figure 16:
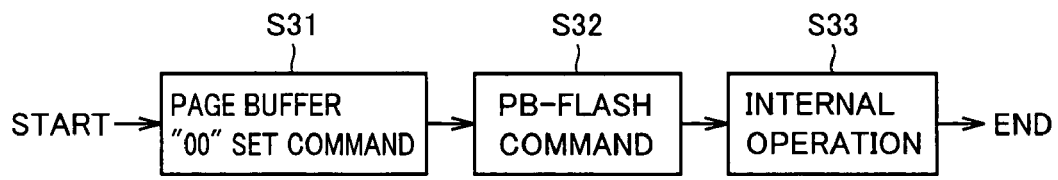
FIG. 16 is a flow chart representing an erasure operation confirmation test procedure of non-volatile semiconductor memory device 1C of the third embodiment.

In a programming operation, data of 128 words are programmed at one time using a page program. When the program is completed in a non-volatile semiconductor memory device of a specification does not leave the former writing data (flash memory), all the data in the page buffer will become FF (all "1"). Therefore, data "00" of 128 words must be similarly loaded in the next programming operation following the erasure. The time required to load the data of 128 words (all 0) through a tester from an external source is of a nonnegligible level. Furthermore, since erasure/programming is repeated for a plurality of times in the erasure/program repetitive testing, the erasure/program repetitive testing takes considerable time. An erasure/programming repetitive test procedure of the third embodiment overcoming such a problem will be described hereinafter with reference to the flow chart of FIG. 16.

At step S31, a page buffer "00" set command to set "00" is applied from an external source to CUI 31 of FIG. 14. At step S32, a PB-flash command is applied from an external source to CUI 31 of FIG. 14. In response, an internal operation repeating erasure/programming is carried out at step S33.

In non-volatile semiconductor memory device 1C of the third embodiment, the data stored in page buffer 35 all can be set instantly to "0" by rendering active the bit line clear signals NIBL and NBL applied to page buffer 35, as shown in FIG. 14. A portion of the circuit configuration of page buffer 35 of FIG. 14 will be described with reference to FIG. 17.

Figure 17:
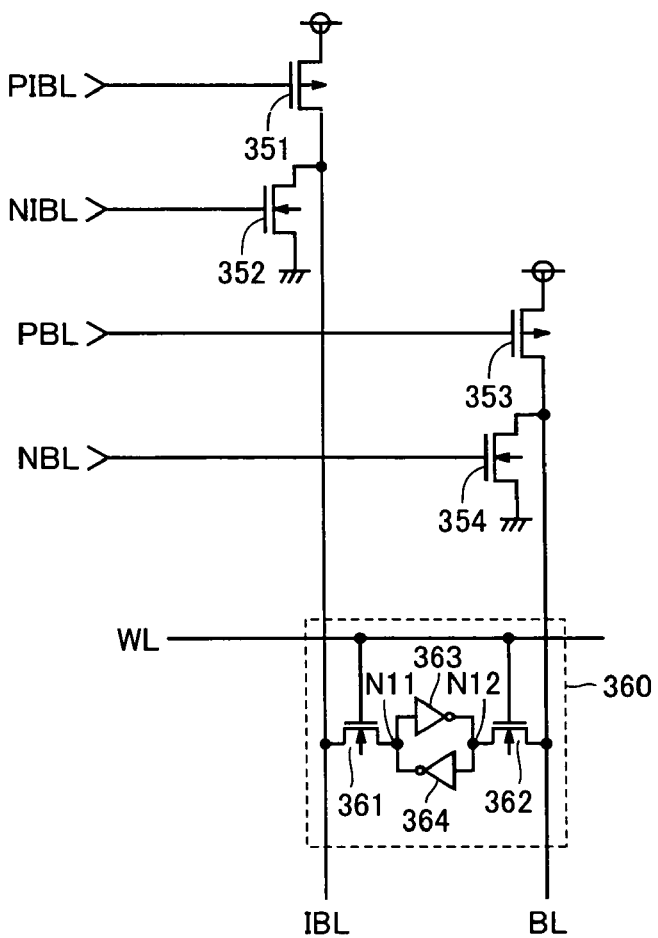
FIG. 17 is a circuit diagram showing a portion of a specific configuration of a page buffer 35 of the third embodiment.

Referring to FIG. 17, page buffer 35 of the third embodiment includes P channel MOS transistors 351 and 353, N channel MOS transistors 352 and 354, and a memory cell 360. Memory cell 360 includes N channel MOS transistors (access transistor) 361 and 362, and inverters 363 and 364.

P channel MOS transistors 351 is connected between a power supply node and bit line IBL to receive bit line precharge signal PIBL at its gate. N channel MOS transistor 352 is connected between bit line IBL and a ground node, and receives bit line clear signal NBL at its gate. P channel MOS transistor 353 is connected between the power supply node and bit line BL, and receives bit line precharge signal PBL at its gate. N channel MOS transistor 354 is connected between bit line BL and the ground node, and receives bit line clear signal NBL at its gate. Bit lines IBL and BL form a pair of bit lines, complementary to each other.

In memory cell 360, N channel MOS transistor 361 is connected between bit line IBL and a node N11, and has its gate connected to a word line WL. N channel MOS transistor 362 is connected between bit line BL and a node N12, and has its gate connected to word line WL. Inverters 363 and 364 are connected in a cyclic manner with respect to each other between nodes N11 and N12. Thus, memory cells 360 has an SRAM circuit configuration.

Page buffer 35 of the third embodiment has a configuration in which N channel MOS transistor 354 for clearing is added to bit line BL, likewise N channel MOS transistor 352 for clearing, generally added to bit line IBL. As N channel MOS transistor 352 can be controlled by bit line clear signal NIBL, N channel MOS transistor 354 can be controlled by bit line clear signal NBL.

Page buffer 35 of the third embodiment can draw out the charge of bit line pair IBL and BL instantly to the ground node in accordance with bit line clear signals NIBL and NBL. Accordingly, all the data stored in page buffer 35 can be instantly set to "0".

Non-volatile semiconductor memory device 1C of the third embodiment can instantly set all the data in page buffer 35 to "0" by just applying to CUI 31 a test command to render bit line clear signals NIBL and NBL active without the need to load data "0" from an external source. Furthermore, a programming operation can be conducted from the state where all the data in page buffer 35 are "0" by combining a PB-flash command instead of a normal program command. Accordingly, the time required for data loading can be reduced. Thus, the erasure/programming repetitive test takes less time.

By applying a test command to render bit line clear signals NIBL and NBL active into CUI 31 in the third embodiment, the time required for an erasure/programming repetitive test can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
   a command input unit recognizing an externally applied command input,
   a verify circuit receiving a control signal from said command input unit to output a verify determination signal,
   a memory cell from which memory cell data is read out to said verify circuit,
   a page buffer storing said memory cell data via said verify circuit to output page buffer data to said verify circuit, and
   a status register comparing and determining said verify determination signal of a plurality of addresses to output a final determination signal,
   wherein said verify circuit can conduct expected value comparison of said memory cell data in addition to a verify operation.

2. The non-volatile semiconductor memory device according to claim 1, wherein said verify circuit takes a plurality of operation modes in accordance with a logic combination of a plurality of verify control signals, and receives said memory cell data and said page buffer data to output said verify determination signal in accordance with a total determination signal that is a logical product of partial determination signals of a plurality of bits and a logic signal depending upon said plurality of operation modes.

3. The non-volatile semiconductor memory device according to claim 1, wherein said status register outputs said final determination signal after repeating, for all addresses, an operation of taking a logical product between said verify determination signal at a certain address and a signal based on superposition of said verify determination signal at another address.

4. A non-volatile semiconductor memory device comprising:
   a command input unit recognizing an externally applied command input,
   a control circuit receiving a control signal from said command input unit to output an OER control signal that sets an over erase recovery operation,
   a loop timer receiving said OER control signal to set a timer for an over erase recovery operation to output an abort signal in accordance with a timer operation, and
   a status register controlling acceptance of an internal command.

5. The non-volatile semiconductor memory device according to claim 4, wherein said loop timer comprises
   a timer circuit receiving said OER control signal to set a timer for an over erase recovery operation and output a data signal, and
   a decode circuit decoding said data signal to output said abort signal in accordance with whether an over erase recovery operation is completed within a set time of said timer.

6. A non-volatile semiconductor memory device comprising:

a command input unit recognizing an externally applied command input, a verify circuit receiving a control signal from said command input unit to carry out a verify operation, a memory cell from which memory cell data is read out to said verify circuit, a page buffer receiving an externally applied data input and a bit line clear signal from said command input unit to store said memory cell data via said verify circuit, and providing page buffer data to said verify circuit, and a status register storing a verify determination result output from said verify circuit, wherein said page buffer can instantly set the data stored in said page buffer to "0" in accordance with said bit line clear signal.

7. The non-volatile semiconductor memory device according to claim 6 wherein said page buffer comprises a memory cell, a word line selecting said memory cell, a bit line and a complementary bit line that is complementary to said bit line for reading/writing data with respect to said memory cell, a first transistor connected between said bit line and a ground node, receiving a first bit line clear signal at a gate, and a second transistor connected between said complementary bit line and the ground node, receiving a second bit line clear signal at a gate, wherein said first and second transistors can instantly set data stored in said memory cell to "0" in accordance with said first and second bit line clear signals, respectively.

* * * * *